United States Patent
Min

(10) Patent No.: US 9,847,485 B2
(45) Date of Patent: Dec. 19, 2017

(54) MASK FRAME ASSEMBLY, DISPLAY MANUFACTURING APPARATUS INCLUDING MASK FRAME ASSEMBLY, AND METHOD OF MANUFACTURING DISPLAY APPARATUS USING MASK FRAME ASSEMBLY

(71) Applicant: Samsung Display Co., Ltd., Yongin-si (KR)

(72) Inventor: Soohyun Min, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/170,549

(22) Filed: Jun. 1, 2016

(65) Prior Publication Data

US 2017/0141313 A1 May 18, 2017

(30) Foreign Application Priority Data

Nov. 13, 2015 (KR) .......................... 10-2015-0159697

(51) Int. Cl.
*H01L 51/52* (2006.01)
*H01L 51/00* (2006.01)
(Continued)

(52) U.S. Cl.
CPC ........ *H01L 51/0011* (2013.01); *C23C 14/042* (2013.01); *C23C 14/0641* (2013.01); *C23C 14/0676* (2013.01); *C23C 14/08* (2013.01); *C23C 14/221* (2013.01); *C23C 14/24* (2013.01); *C23C 14/34* (2013.01); *H01L 51/56* (2013.01); *H01L 27/3244* (2013.01); *H01L 51/5256* (2013.01); *H01L 2227/323* (2013.01); *H01L 2251/5338* (2013.01)

(58) Field of Classification Search
CPC . H01L 51/0017; H01L 51/56; H01L 51/0011; H01L 51/5256
See application file for complete search history.

(56) References Cited

U.S. PATENT DOCUMENTS

2007/0023702 A1* 2/2007 Yotsuya .............. H01L 51/0017
250/492.22
2010/0192856 A1 8/2010 Sung et al.
(Continued)

FOREIGN PATENT DOCUMENTS

KR 10-2010-0000128 1/2010
KR 10-2011-0017503 2/2011
(Continued)

*Primary Examiner* — Kyoung Lee
*Assistant Examiner* — Christina Sylvia
(74) *Attorney, Agent, or Firm* — H.C. Park & Associates, PLC

(57) ABSTRACT

A mask frame assembly includes a frame, a first support bar, split masks, and a second support bar. The frame includes an opening. The first support bar spans the opening in a first direction, the first support bar includes first ends disposed on the frame. The split masks span the opening in a second direction crossing the first direction, the split masks include first portions disposed on the first support bar and second ends disposed on the frame. The second support bar is disposed on the first support bar, the second support bar being more magnetic than the first support bar.

18 Claims, 8 Drawing Sheets

(51) Int. Cl.
  *C23C 14/04* (2006.01)
  *C23C 14/06* (2006.01)
  *C23C 14/08* (2006.01)
  *C23C 14/22* (2006.01)
  *C23C 14/34* (2006.01)
  *H01L 51/56* (2006.01)
  *C23C 14/24* (2006.01)
  *H01L 27/32* (2006.01)

(56) References Cited

U.S. PATENT DOCUMENTS

2011/0146573 A1* 6/2011 Park ............... C23C 14/042
                                                    118/712
2012/0279444 A1* 11/2012 Hong ............. C23C 14/042
                                                    118/504
2014/0120796 A1  5/2014 Kim et al.

FOREIGN PATENT DOCUMENTS

| KR | 10-2011-0069466 | 6/2011 |
| KR | 10-2014-0052707 | 5/2014 |

* cited by examiner

MASK FRAME ASSEMBLY, DISPLAY MANUFACTURING APPARATUS INCLUDING MASK FRAME ASSEMBLY, AND METHOD OF MANUFACTURING DISPLAY APPARATUS USING MASK FRAME ASSEMBLY

CROSS-REFERENCE TO RELATED APPLICATION

This application claims priority from and the benefit of Korean Patent Application No. 10-2015-0159697, filed on Nov. 13, 2015, which is hereby incorporated by reference for all purposes as if fully set forth herein.

BACKGROUND

Field

Exemplary embodiments relate to a mask frame assembly, a display manufacturing apparatus including the mask frame assembly, and a method of manufacturing a display apparatus using the mask frame assembly.

Discussion of the Background

Mobile electronic devices, such as mobile phones, notebook computers, personal digital assistants, tablets, etc., are widely used. These devices typically include a display unit to provide users with visual information, such as an image or video information, in order to support various functions. Components for driving display units have become smaller, but the display units themselves have become more important in conventional mobile electronic devices. It is also noted that a structure for bending a display unit from a first (e.g., flat) state to a second (e.g., bent at a certain angle) state has been developed.

A conventional display apparatus may be manufactured using a vacuum deposition process performed by depositing, for instance, a metal material or an organic material that may be used as an electrode or organic layer on a substrate in a vacuum environment to form a thin film on the substrate. The vacuum deposition process may be performed by locating a substrate upon which a thin film is to be formed in a vacuum chamber, adhering a mask, e.g., a fine metal mask (FMM), to the substrate (or over the substrate), and depositing a material on the substrate by evaporating or sublimating the material using a deposition source. The mask typically will have the same (or a similar) pattern as a pattern to be formed as the thin film.

Typically, to manufacture a relatively high resolution display device, it may be beneficial to minimize (or at least reduce) a shadow effect associated with utilizing a mask. As such, the vacuum deposition process is usually performed with the mask in relatively close contact with a substrate or a layer on the substrate. It is noted, however, that as a mask becomes thinner, a gap between the mask and the substrate may increase. As such, the shadow effect may increase.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a mask frame assembly configured to minimize (or at least reduce) a gap between the mask frame assembly and a substrate to receive a deposition material based on a configuration of the mask frame assembly. In this manner, the mask frame assembly is further configured to enable more precise deposition patterns to be formed on the substrate.

One or more exemplary embodiments provide a display manufacturing apparatus including the mask frame assembly.

One or more exemplary embodiments provide a method of manufacturing a display apparatus using the mask frame assembly.

Additional aspects will be set forth in the detailed description which follows, and, in part, will be apparent from the disclosure, or may be learned by practice of the inventive concept.

According to one or more exemplary embodiments, a mask frame assembly includes a frame, a first support bar, split masks, and a second support bar. The frame includes an opening. The first support bar spans the opening in a first direction, the first support bar includes first ends disposed on the frame. The split masks span the opening in a second direction crossing the first direction, the split masks include first portions disposed on the first support bar and second ends disposed on the frame. The second support bar is disposed on the first support bar, the second support bar being more magnetic than the first support bar.

According to one or more exemplary embodiments, a display manufacturing apparatus includes a mask frame assembly, a supporter, an electrostatic chuck, and a vapor deposition source. The supporter is configured to support the mask frame assembly. The electrostatic chuck is configured to support a substrate in relation to the mask frame assembly. The vapor deposition source is configured to eject a deposition material towards the substrate. The mask frame assembly includes a frame, a first support bar, split masks, and a second support bar. The frame includes an opening. The first support bar spans the opening in a first direction, the first support bar includes first ends disposed on the frame. The split masks span the opening in a second direction crossing the first direction, the split masks include first portions disposed on the first support bar and second ends disposed on the frame. The second support bar is disposed on the first support bar, the second support bar being more magnetic than the first support bar.

According to one or more exemplary embodiments, a method of manufacturing a display apparatus includes: causing, at least in part, a substrate of the display apparatus to be positioned with respect to a mask frame assembly; and causing, at least in part, a deposition material to be deposited on the substrate according to deposition patterns of the mask frame assembly. The mask frame assembly includes a frame, a first support bar, split masks, and a second support bar. The frame includes an opening. The first support bar spans the opening in a first direction, the first support bar includes first ends disposed on the frame. The split masks span the opening in a second direction crossing the first direction, the split masks include first portions disposed on the first support bar and second ends disposed on the frame. The second support bar is disposed on the first support bar, the second support bar being more magnetic than the first support bar.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
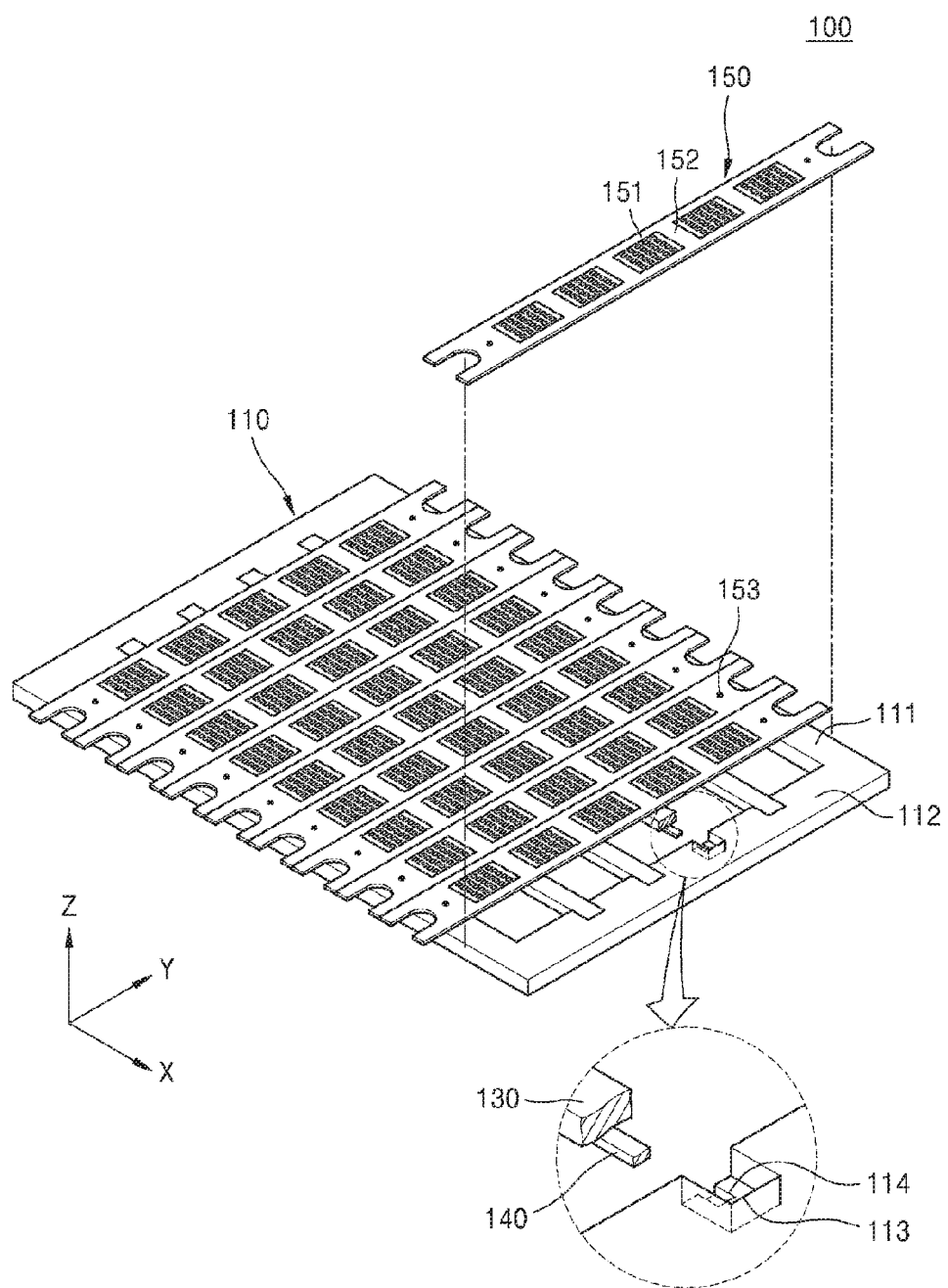
FIG. 1 is a perspective view of a mask frame assembly, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to mask frame assemblies that may be utilized to fabricate an organic light emitting display apparatus, it is contemplated that various exemplary embodiments are also applicable to manufacturing semiconductor devices and display devices in general, such as, for example, liquid crystal displays, plasma displays, field emission displays, electrophoretic displays, electrowetting displays, etc.

Figure 2:
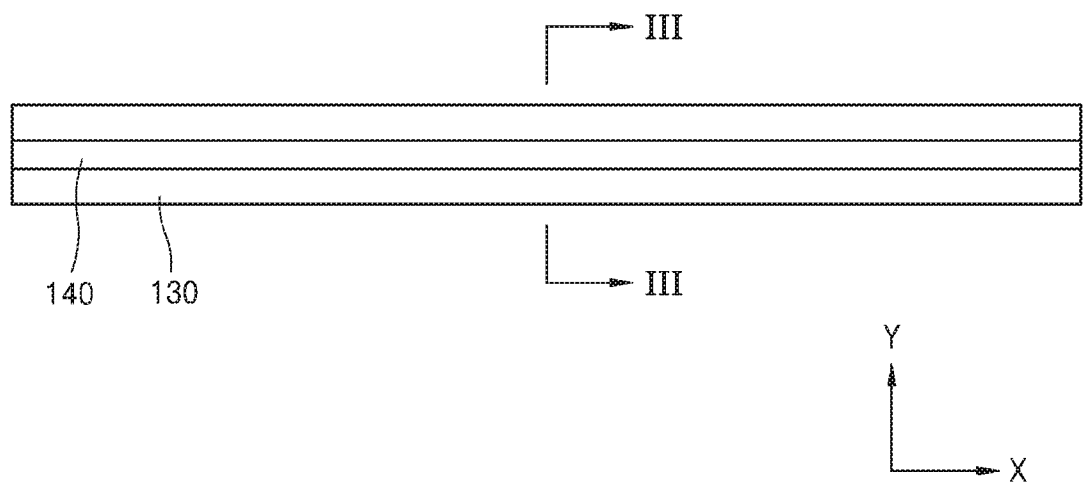
FIG. 2 is a bottom view of a first support bar and a second support bar of the mask frame assembly of FIG. 1, according to one or more exemplary embodiments.
Figure 3:
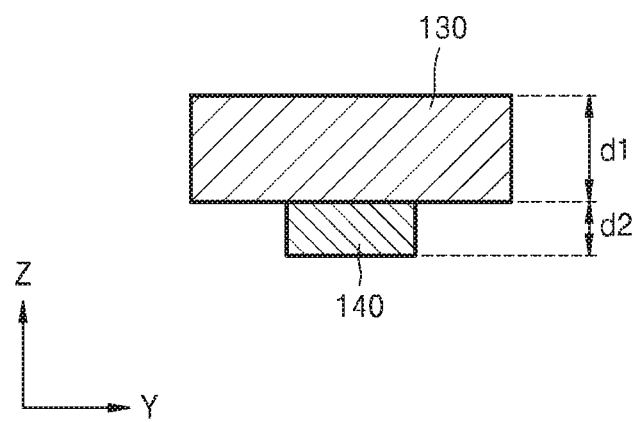
FIG. 3 is a cross-sectional view of the first support bar and the second support bar of FIG. 2 taken along sectional line III-Ill, according to one or more exemplary embodiments.

FIG. 1 is a perspective view of a mask frame assembly, according to one or more exemplary embodiments. FIG. 2 is a bottom view of a first support bar and a second support bar of the mask frame assembly of FIG. 1, according to one or more exemplary embodiments. FIG. 3 is a cross-sectional view of the first support bar and the second support bar of FIG. 2 taken along sectional line III-III, according to one or more exemplary embodiments.

Referring to FIGS. 1 through 3, a mask frame assembly 100 may include a frame 110, a first support bar 130, a second support bar 140, and a plurality of split masks 150.

The frame 110 may be formed of any suitable material, such as metal or a synthetic resin, etc., and may have a quadrangular shape having at least one opening. However, exemplary embodiments are not limited thereto. For instance, the frame 110 may be formed having various shapes, such as a circular shape, a hexagonal shape, etc. However, for descriptive convenience, an example in which the frame 110 has a quadrangular shape will be discussed.

The frame 110 may include a pair of first frames 111 extending in a first (e.g., x axis) direction, and a pair of second frames 112 extending in a second (e.g., y axis) direction and coupled to the first frames 111. The first frames 111 and the second frames 112 may form an opening and the opening may be surrounded by the pair of the first frames 111 and the pair of the second frames 112.

The first support bar 130 may be disposed in the opening parallel to the first frames 111 and coupled to the frame 110. For instance, the first support bar 130 may be disposed in the opening and may have ends coupled to the second frames 112. The ends of the first support bar 130 may be mounted in and fixed to a first groove 113 of the second frames 112. The first support bar 130 may be fixed to the first groove 113 by welding or using an adhesive material. It is contemplated, however, that any other suitable coupling mechanism or technique may be utilized in association with exemplary embodiments described herein.

The first support bar 130 may support the plurality of split masks 150. The first support bar 130 may support rib portions 152 of the split masks 150. The first support bar 130 may prevent deflection (e.g., gravitational deflection) of the split masks 150 by dispersing the weight of the split masks 150 over a number of the first support bars 130. For instance, as seen in FIG. 1, weight of a split mask 150 may be divided among four first support bars 130, but exemplary embodiments are not limited thereto.

According to one or more exemplary embodiments, the first support bar 130 may be formed of a material having relatively weak magnetism. For example, the first support bar 130 may be formed of stainless steel (SUS), however, any other suitable material may be utilized in association with exemplary embodiments described herein. A surface of the first support bar 130 may contact the split masks 150. If the first support bar 130 is formed of a material having a relatively strong magnetism, strong magnetic attraction may act between an electrostatic chuck 180 (see FIG. 11) and the first support bar 130. To this end, a gap may be formed between a substrate 11 (see FIG. 11) and the split masks 150, and pattern parts 151 of the split masks 150 may not be accurately aligned on (or with) the substrate 11. As such, the first support bar 130 may be formed of a material with relatively weak magnetism such that a gap may be minimized (or at least reduced) between the mask frame assembly 100 and the substrate 11. This may also enable more accurate alignment between the pattern parts 151 and the substrate 11.

The second support bar 140 may be coupled to the first support bar 130. For instance, the second support bar 140 may be mounted on the first support bar 130 and may be fixed to the first support bar 130 in a manner facing the split masks 150. For instance, as seen in FIG. 1, the second support bar 140 may be coupled to a first surface of the first support part 130 opposing a second surface upon which the split masks 150 are disposed. The second support bar 140 may be mounted in and fixed to a second groove 114 of the second frames 112. The second support bar 140 may be fixed to the second groove 114 by welding or using an adhesive material. It is contemplated, however, that any other suitable coupling mechanism or technique may be utilized in association with exemplary embodiments described herein. The second support bar 140 may be formed of a material with relatively stronger magnetism than the first support bar 130. For example, the second support bar 140 may be formed of INVAR (e.g., a nickel-iron alloy), iron (Fe), cobalt (Co), or nickel (Ni), and/or an alloy thereof. It is contemplated, however, that any other suitable material may be utilized in association with exemplary embodiments described herein. Further, a content of at least one of Fe, Co, and Ni in the second support bar 140 may be greater than a content of at least one of Fe, CO, and Ni in the first support bar 130.

According to one or more exemplary embodiments, the first support bar 130 may have a relatively weak magnetism. In this manner, a gap between the substrate 11 and the split masks 150 may be generated if a magnetic field is applied to the electrostatic chuck 180. Given that the second support bar 140 has relatively strong magnetic attraction with the electrostatic chuck 180, the gap between the substrate 11 and the split masks 150 may be minimized (or at least reduced).

The split masks 150 may be disposed on the frame 110 and the first support bars 130, and may cross the opening of the frame 110 in the second direction. The split masks 150 may include ends fixed to the frame 110. The ends of the split masks 150 may be fixed to the first frames 111 via a connection (e.g., welded) portion 153. The split masks 150 may include the pattern parts 151 through which a deposition material passes during a deposition process and the rib portions 152 supporting (or otherwise disposed between) the pattern parts 151. The first support bar 130 may prevent gravitational deflection of the split masks 150 by supporting the rib portions 152 of the split masks 150.

Referring to FIG. 3, the first support bar 130 and the second support bar 140 may have a thickness in a third direction, which is perpendicular to the first direction and the second direction. A thickness d1 of the first support bar 130 may be greater than a thickness d2 of the second support bar 140. The first support bar 130 may have a determined thickness to enable rigidity, and, as such, may support the plurality of split masks 150. The thickness d2 of the second support bar 140 may be smaller than the thickness d1 of the first support bar 130, and may be configured to prevent deflection of the first support bar 130.

Figure 4A:
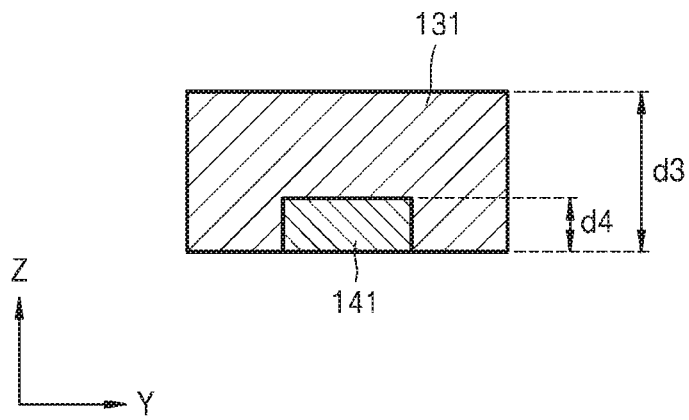
FIGS. 4A through 4C are cross-sectional views of the first support bar and the second support bar of FIG. 2 taken along sectional line III-III, according to one or more exemplary embodiments.
Figure 4B:
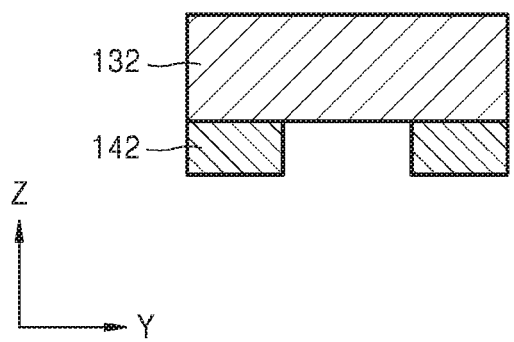
Figure 4C:
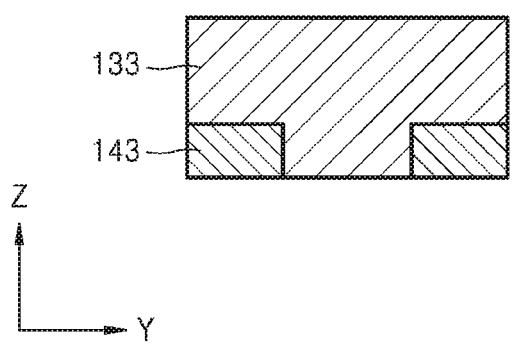

FIGS. 4A through 4C are cross-sectional views of the first support bar and the second support bar of FIG. 2 taken along sectional line III-III, according to one or more exemplary embodiments.

Referring to FIG. 4A, at least a portion of a second support bar 141 may be mounted on a first support bar 131. The second support bar 141 may be mounted in a groove of the first support bar 131. As the second support bar 141 may be mounted in the first support bar 131 to be included therein, a deposition material may be deposited more accurately on a substrate during a deposition process. For instance, a deposition material may pass between adjacent first support bars 131 when the deposition material is injected during a deposition process. When the second support bar 141 is projected from the first support bar 131, the accuracy of deposition may decrease as the second support bar 141 may disturb a moving direction of the deposition material. According to one or more exemplary embodiments, a thickness d3 of the first support bar 131 may be greater than a thickness d4 of the second support bar 141, and the first support bar 131 and the second support bar 141 may form a flat surface as the second support bar 141 is mounted in the first support bar 131. The efficiency of the deposition process may be improved by removing the projected portion of the first support bar 131.

Referring to FIG. 4B, a plurality of second support bars 142 may be formed on a first support bar 132. The second support bar 142 may be fixed to an edge of the first support bar 132. The edge of the first support bar 132 may be aligned with a boundary region between the rib portions 152 and the pattern parts 151 of the split masks 150. As the second support bar 142 is fixed to the edge of the first support bar 132, an adhesion of the substrate 11 and the split masks 150 in a boundary region of the pattern parts 151 may be improved.

Referring to FIG. 4C, a plurality of second support bars 143 may be mounted on a first support bar 133. For instance, the second support bar 143 may be aligned with an edge of the first support bar 133. An adhesion of the substrate 11 and the split masks 150 in a boundary region between the rib portions 152 and the pattern parts 151 of the split masks 150 may be improved, and an accuracy of deposition may be improved by removing a projected portion of the first support bar 133.

Figure 5:
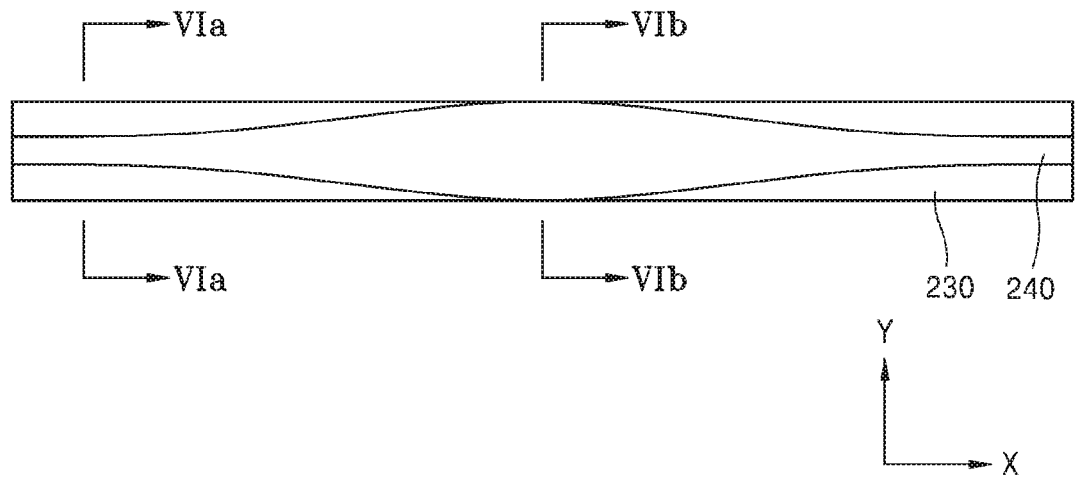
FIG. 5 is a bottom view of a first support bar and a second support bar of the mask frame assembly of FIG. 1, according to one or more exemplary embodiments.
Figure 6A:
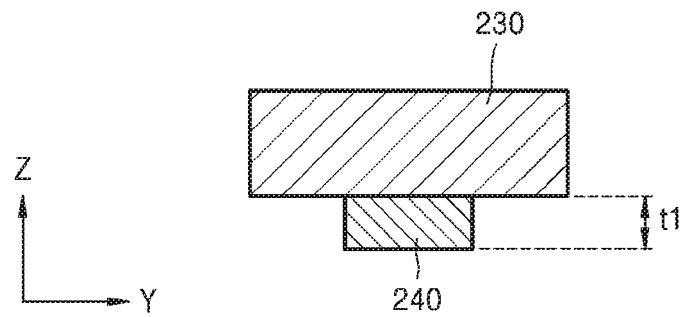
FIG. 6A is a cross-sectional view of the first support bar and the second support bar of FIG. 5 taken along sectional line VIa-VIa, according to one or more exemplary embodiments.
Figure 6B:
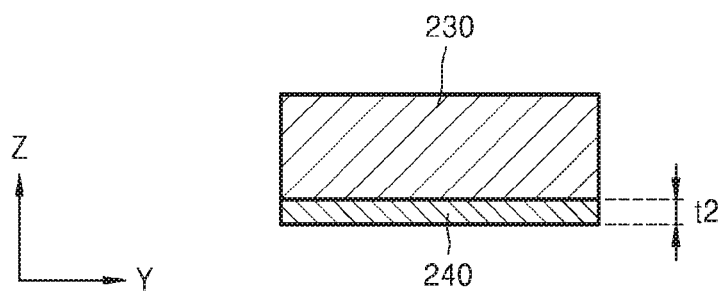
FIG. 6B is a cross-sectional view of the first support bar and the second support bar of FIG. 5 taken along sectional line VIb-VIb, according to one or more exemplary embodiments.

FIG. 5 is a bottom view of a first support bar and a second support bar of the mask frame assembly of FIG. 1, according to one or more exemplary embodiments. FIG. 6A is a cross-sectional view of the first support bar and the second support bar of FIG. 5 taken along sectional line VIa-VIa, according to one or more exemplary embodiments. FIG. 6B is a cross-sectional view of the first support bar and the second support bar of FIG. 5 taken along sectional line VIb-VIb, according to one or more exemplary embodiments.

Referring to FIGS. 5, 6A, and 6B, a thickness of a second support bar 240 may be variable. For instance, the thickness of the second support bar 240 may decrease from the center to ends in the first direction. For example, a thickness of the second support bar 240 in ends of a first support bar 230 may be t1, and a thickness of the second support bar 240 in the center of the first support bar 230 may be t2. As the center of the first support bar 230 in the first direction may be located in an opening of the frame 110, a gravitational deflection may occur due to the weight of the first support bar 230. The deflection may be minimized by making a thickness of the second support bar 240 in the center of the first support bar 230 relatively small.

The second support bar 240 may have a width in the second direction. The width of the second support bar 240 may be variable. For instance, the width of the second support bar 240 may decrease from the center to ends in the first direction. As the split masks 150 have gravitational deflection in the center of the opening of the frame 110, relatively strong magnetic attraction may be more desirable in the center of the frame 110 to prevent the deflection. For example, the second support bar 240 may generate relatively strong magnetic attraction with the electrostatic chuck 180 in the center of the first support bar 230 and may minimize (or at least reduce) the gap between the substrate 11 and the split masks 150. The width of the second support bar 240 may be greater in the center of the first support bar 230 in the second direction than in ends of the first support bar 230. The second support bar 240 may generate relatively stronger magnetic attraction with the electrostatic chuck 180 in the center of the first support bar 230 than at ends of the first support bar 230 spaced apart from the center in the first direction.

Figure 7:
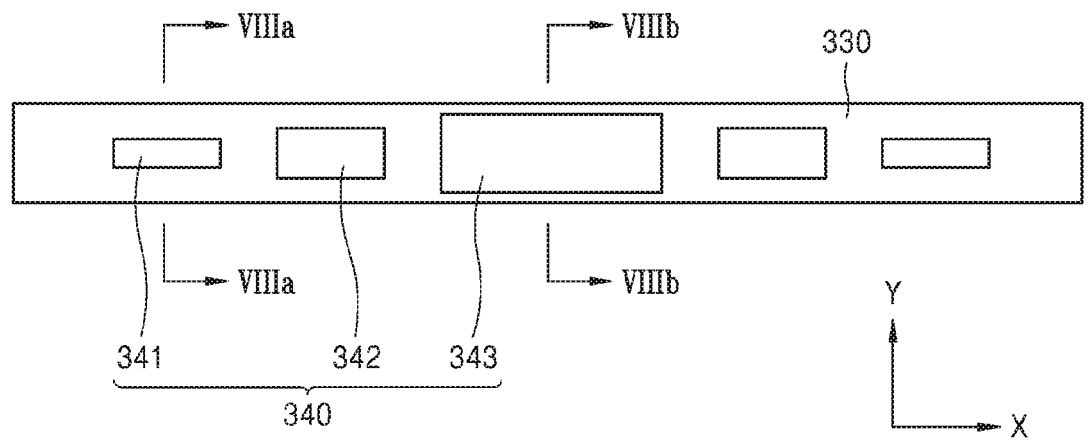
FIG. 7 is a bottom view of a first support bar and a second support bar of FIG. 1, according to one or more exemplary embodiments.
Figure 8A:
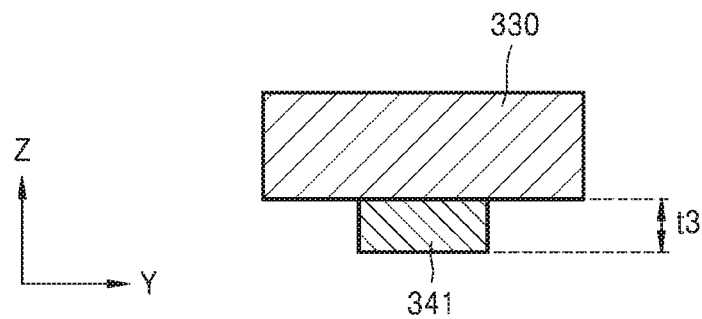
FIG. 8A is a cross-sectional view of the first support bar and the second support bar of FIG. 7 taken along sectional line VIIIa-VIIIa, according to one or more exemplary embodiments.
Figure 8B:
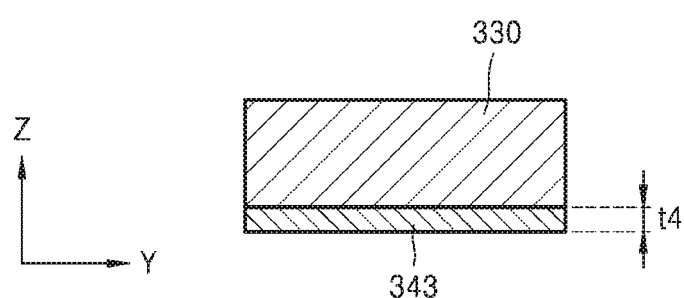
FIG. 8B is a cross-sectional view of the first support bar and the second support bar of FIG. 7 taken along sectional line VIIIb-VIIIb, according to one or more exemplary embodiments.

FIG. 7 is a bottom view of a first support bar and a second support bar of FIG. 1, according to one or more exemplary embodiments. FIG. 8A is a cross-sectional view of the first support bar and the second support bar of FIG. 7 taken along sectional line VIIIa-VIIIa, according to one or more exemplary embodiments. FIG. 8B is a cross-sectional view of the first support bar and the second support bar of FIG. 7 taken along sectional line VIIIb-VIIIb, according to one or more exemplary embodiments.

Referring to FIGS. 7, 8A, and 8B, second support bars 340 may be spaced apart from one another in the first direction. For example, the second support bars 340 may include a first support bar portion 341 formed in an end thereof, a second support bar portion 342 spaced apart from the first support bar portion 341 in the first direction, and a third support bar portion 343 formed in the center (or central region) of a first support bar 330 in the first direction.

A thickness of the second support bars 340 may decrease from the center to ends in the first direction. A thickness t3 of the first support bar portion 341 may be greater than a thickness of the second support bar portion 342, and the thickness of the second support bar portion 342 may be greater than a thickness t4 of the third support bar portion 343. A gravitational deflection of the first support bar 330 may be prevented (or at least reduced) by forming the third support bar portion 343 with a relatively small thickness.

A width of the second support bars 340 may decrease from the center to ends in the first direction. A width of the first support bar portion 341 may be smaller than a width of the second support bar portion 342, and a width of the second support bar 342 may be smaller than a width of the third support bar portion 343. The second support bars 340 may generate relatively strong magnetic attraction with the electrostatic chuck 180 in the center of the first support bar 330 and may minimize (or at least reduce) a gap between the substrate 11 and the split masks 150.

Figure 9:
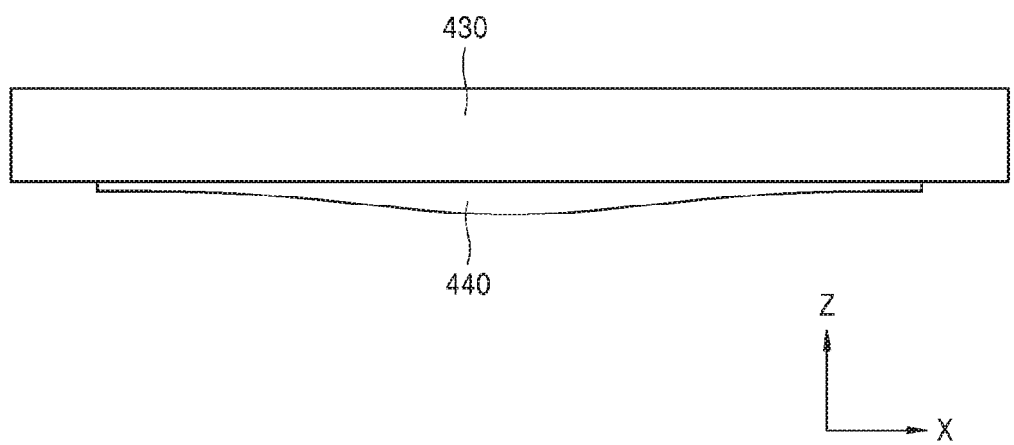
FIGS. 9 and 10 are side views of a first support bar and a second support bar of FIG. 1, according to one or more exemplary embodiments.
Figure 10:
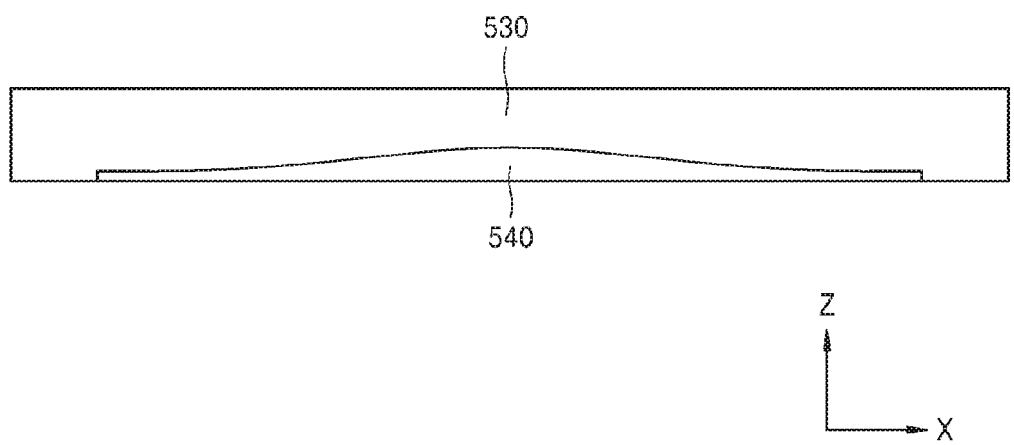

FIGS. 9 and 10 are side views of a first support bar and a second support bar of FIG. 1, according to one or more exemplary embodiments.

Referring to FIG. 9, a thickness of a second support bar 440 may be variable. For example, the thickness of the second support bar 440 may decrease from the center to ends in the first direction. The second support bars 440 may generate relatively strong magnetic attraction with the electrostatic chuck 180 in the center of a first support bar 430 and may minimize (or at least reduce) the gap between the substrate 11 and the split masks 150.

Referring to FIG. 10, a second support bar 540 may be mounted in a first support bar 530 and may not be projected from a surface of the first support bar 530.

Figure 11:
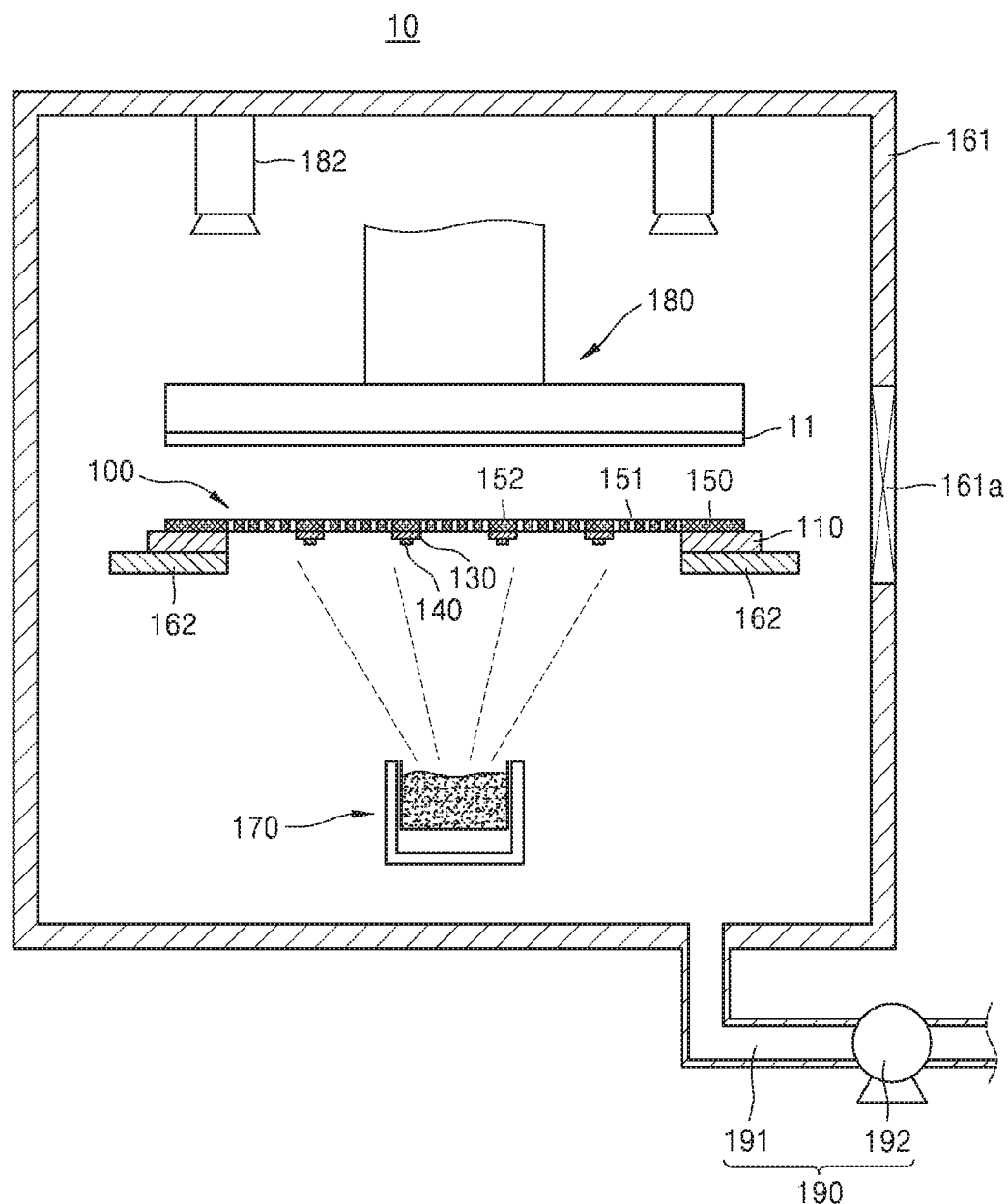
FIG. 11 is a schematic cross-sectional view of a display manufacturing apparatus including the mask frame assembly of FIG. 1, according to one or more exemplary embodiments.

FIG. 11 is a schematic cross-sectional view of a display manufacturing apparatus including the mask frame assembly of FIG. 1, according to one or more exemplary embodiments.

The display manufacturing apparatus (e.g., a deposition apparatus for manufacturing a display apparatus) 10 may include the mask frame assembly 100, a chamber 161, a supporter 162, a deposition source 170, an electrostatic chuck 180, and a vision part 182. The mask frame assembly 100 may be the mask frame assembly 100 illustrated and described in association with FIG. 1. Although specific reference will be made to this particular implementation, it is also contemplated that display manufacturing apparatus 10 may embody many forms and include multiple and/or alternative components.

The chamber 161 may have an inner space, pressurized space, and a portion of the chamber 161 may be open. A gate valve 161a, etc., may be installed in the open portion of the chamber 161, to open and close the open portion. The mask frame assembly 100 may be mounted on the supporter 162, which may be configured to rotate and/or linearly move the mask frame assembly 100. A deposition material may be loaded in the deposition source 170, and evaporated and/or sublimated in the deposition source 170. The evaporated and/or sublimated deposition material may be deposited on the substrate 11 via the plurality of split masks 150.

The electrostatic chuck 180 may align the substrate 11 with the mask frame assembly 100 after adhering (or otherwise displaced or coupling) the mask frame assembly 100 to the substrate 11 using electromagnetic force. For instance, the electrostatic chuck 180 may align the substrate 11 with the mask frame assembly 100 accurately using information obtained via the vision part 182.

The display manufacturing apparatus 10 may deposit a deposition material on the substrate 11 in a state in which the substrate 11 is supported. According to one or more exemplary embodiments, the deposition material may be deposited on the substrate 11 while one or both of the substrate 11 and the deposition source 170 move relative to each other. For descriptive convenience, an example in which the deposition material is deposited on the substrate 11 in the state in which the substrate 11 is supported will be discussed.

A pressure adjusting part 190 may be connected to the chamber 161. The pressure adjusting part 190 may include a connection pipe 191 connected to the chamber 161, and a pump 192 installed in (or otherwise connected to) the connection pipe 191. The pressure adjusting part 190 may be utilized to pressurize an interior environment of the chamber 161, such as to provide a vacuum environment for a deposition process.

The display manufacturing apparatus 10 may be utilized to form an organic layer, an inorganic layer, or a metal layer. For descriptive convenience, an example in which the display manufacturing apparatus 10 forms an organic layer will be described. For instance, the example in which the display manufacturing apparatus 10 forms an intermediate layer 682 (see FIG. 12) among organic layers of display apparatus 600 will be described.

According to one or more exemplary embodiments, the substrate 11 and the mask frame assembly 100 may be loaded into the chamber 161 from the outside of the chamber 161 and may be supported by the supporter 162, respectively. After locations of the mask frame assembly 100 and the substrate 11 are initially established and measured via the vision part 182, the substrate 11 and the mask frame assembly 100 may be arranged using the electrostatic chuck 180. The vision part 182 may include a camera for photographing the mask frame assembly 100 and the substrate 11, however, any other suitable imaging and/or visual inspection device may be utilized in association with exemplary embodiments.

The electrostatic chuck 180 may adhere the substrate 11 to the mask frame assembly 100 using electromagnetic force. A gap between the substrate 11 and the mask frame assembly 100 is to be minimized. The mask frame assembly 100 may mount the second support bar 140 with relatively stronger magnetism on the first support bar 130, and may generate relatively strong magnetic attraction with the electrostatic chuck 180. For instance, magnetic attraction between the second support bar 140 and the electrostatic chuck 180 may adhere the mask frame assembly 100 to the substrate 11.

After the mask frame assembly 100 and the substrate 11 are arranged, a deposition material may be evaporated and/or sublimated by driving the deposition source 170. The deposition material may be deposited on the substrate 11 by passing through an opening between the first support bar 130 and the second support bar 140 and by passing through the pattern parts 151 of the plurality of split masks 150. Then, the substrate 11, on which the deposition material has been deposited, may be drawn to the outside the chamber 161 to perform one or more other manufacturing and/or verification processes.

In association with manufacturing a relatively high-resolution display device, a deposition pattern is typically and relatively precisely deposited on the substrate 11. To achieve such deposition of the deposition pattern with a minimized (or at least reduced) shadow effect, a thickness of the split masks 150 may be minimized (or at least reduced). However, as the thickness of the split masks 150 decreases, magnetic attraction of the split masks 150 and the electrostatic chuck 180 may weaken. Accordingly, a gap may exist between the substrate 11 and the mask frame assembly 100, and, as such, a shadow effect may occur. As the thickness of the split masks 150 decreases, the first support bar 130 supporting the split masks 150 may be formed of a material with relatively weak magnetism. If the first support bar 130 has relatively strong magnetism, strong magnetic attraction may be generated by the electrostatic chuck 180 and the first support bar 130. For instance, magnetic attraction may be generated before the substrate 11 is properly aligned on the split masks 150, and, in this manner, an adhesion of the substrate 11 and the split masks 150 may insufficient to ensure a relatively high-resolution pattern.

According to one or more exemplary embodiments, the mask frame assembly 100 may improve the efficiency of a deposition process by minimizing (or at least reducing) a gap between the substrate 11 and the split masks 150. The first support bar 130 may have a relatively weak magnetism so that the substrate 11 may be accurately aligned with the mask frame assembly 100. The second support bar 140 may have a relatively stronger magnetism than the first support bar 130 and may minimize (or at least reduce) a gap between the mask frame assembly 100 and the substrate 11. The mask frame assembly 100 may minimize (or at least reduce) a gravitational deflection of the split masks 150 and the first support bar 130 by increasing a thickness of the second support bar 140 from the center to ends in a length direction of the first support bar 130, as previously described. It is also contemplated that the mask frame assembly 100 may minimize (or at least reduce) a gravitational deflection of the split masks 150 and the first support bar 130 by decreasing a width of the second support bar 140 from the center to ends in a length direction of the first support bar 130, as previously described.

Figure 12:
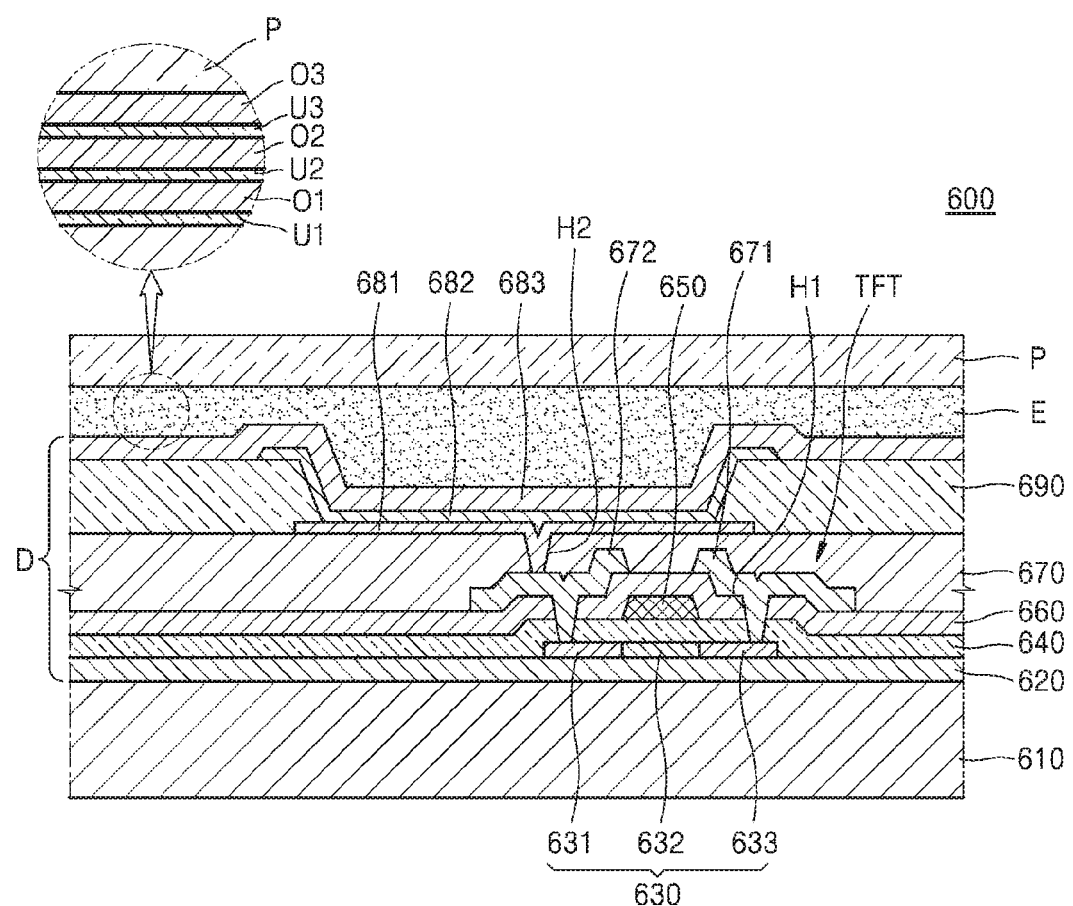
FIG. 12 is a cross-sectional view of a portion of a display apparatus manufactured using the display manufacturing apparatus of FIG. 11, according to one or more exemplary embodiments.

FIG. 12 is a cross-sectional view of a portion of a display apparatus manufactured using the display manufacturing apparatus of FIG. 11, according to one or more exemplary embodiments. For instance, the portion of the display apparatus 600 may be a pixel (or sub-pixel) of the display apparatus 600. Hereinafter, an example in which the portion corresponds to a sub-pixel is described in more detail.

According to one or more exemplary embodiments, sub-pixels of the display apparatus 600 may include at least one thin-film transistor TFT, and an organic light-emitting device. The thin-film transistor TFT is not limited to having a structure shown in FIG. 12, and a number and a structure of the thin-film transistor TFT may be variously modified. As seen in FIG. 12, the display apparatus 600 may include a substrate 610, a display unit D, an encapsulation layer E, and a protection layer P.

The substrate 610 may be formed a flexible insulating material. For example, the substrate 610 may be a polymer substrate formed of polyimide (PI), polycarbonate (PC), polyethersulphone (PES), polyethylene terephthalate (PET), polyethylene naphthalate (PEN), polyarylate (PAR), fiber glass reinforced plastic (FRP), and/or the like. According to one or more exemplary embodiments, the substrate 610 may be a glass substrate having a thickness to such a degree that the substrate 610 may be bent. The substrate 610 may be formed of a metal material. The substrate 610 may be transparent, translucent, or opaque.

A buffer layer 620 formed of an organic compound and/or an inorganic compound may be further formed on a top surface of the substrate 610. The buffer layer 620 may obstruct oxygen and moisture, and may planarize a surface of the substrate 610. The buffer layer 620 may be formed of a material selected from an inorganic material, such as silicon oxide ($SiO_x$), silicon nitride ($SiN_x$), silicon oxynitride ($SiO_xN_y$), aluminum oxide ($AlO_x$), or aluminum oxynitride ($AlO_xN_y$), or an organic material, such as acryl, polyimide, or polyester.

The thin-film transistor TFT may be formed on the buffer layer 620. According to one or more exemplary embodiments, the thin-film transistor TFT refers to a top gate transistor; however, a thin-film transistor having another structure, such as a bottom gate transistor, may be included as the thin-film transistor TFT.

After an active layer 630 having a certain pattern is formed on the buffer layer 620, the active layer 630 is buried by a gate insulating layer 640. The active layer 630 has a drain area 631, and a source area 633, and further includes a channel area 632 therebetween. The active layer 630 may be formed to contain various materials. For example, the active layer 630 may contain an inorganic semiconductor material, such as amorphous silicon or crystalline silicon. As another example, the active layer 630 may contain an oxide semiconductor. For instance, an oxide semiconductor may include an oxide of a material selected from a metal element in a group 12, 13, or 14, such as zinc (Zn), indium (In), gallium (Ga), tin (Sn), cadmium (Cd), germanium (Ge), or hafnium (Hf), or a combination thereof. Hereinafter, an example in which the active layer 630 is formed of amorphous silicon is described in detail.

A gate electrode 650 corresponding to the active layer 630 and an interlayer insulating layer 660 that buries the gate electrode 650 are formed on a top surface of the gate insulating layer 640. After a contact hole H1 is formed on the interlayer insulating layer 660 and the gate insulating layer 640, a source electrode 671 and a drain electrode 672 are formed on the interlayer insulating layer 660 to respectively contact the drain area 631 and the source area 633.

A passivation layer 670 is formed on a top surface of the thin-film transistor TFT, and a pixel electrode 681 of the OLED display apparatus 600 is formed on the passivation layer 670. The pixel electrode 681 may be a transparent (or translucent) electrode or a reflective electrode. If the pixel electrode 681 is a transparent (or translucent) electrode, the pixel electrode 681 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). If the pixel electrode 681 is a reflective electrode, the pixel electrode 681 may include a reflective layer formed of silver (Ag), magnesium (Mg), Al, platinum (Pt), palladium (Pd), gold (Au), nickel (Ni), neodymium (Nd), iridium (Ir), chrome (Cr), or a compound thereof, and a layer formed of ITO, IZO, ZnO, or $In_2O_3$. However, a constitution and a material of the pixel electrode 681 is not limited thereto, and may be variously modified.

The pixel electrode 681 contacts the drain electrode 672 of the thin-film transistor via a via hole H2 formed in the passivation layer 670. The passivation layer 670 may be formed of an inorganic and/or organic material, or formed to have a single layer or two or more layers. The passivation layer 670 may be formed as a planarization layer so that a top surface is smooth regardless of unevenness of a lower layer. However, the passivation layer 670 may also be formed to be uneven according to unevenness of a layer below the passivation layer. In addition, the passivation layer 670 may be formed of a transparent insulator so that a resonance effect may be obtained.

After the pixel electrode 681 is formed on the passivation layer 670, a pixel-defining layer 690 is formed of an organic and/or inorganic material to cover the pixel electrode 681 and the passivation layer 670, and to have an opening to expose the pixel electrode 681. In addition, an intermediate layer 682 and an opposite electrode 683 are formed on the pixel electrode 681. The pixel electrode 681 functions as an anode electrode, and the opposite electrode 683 functions as a cathode electrode. However, polarities of the pixel electrode 681 and the opposite electrode 683 may be changed with each other. The pixel electrode 681 and the opposite electrode 683 are insulated from each other by the intermediate layer 682. An organic emission layer emits light as voltages having different polarities from each other are applied to the intermediate layer 682.

The intermediate layer 682 may include an organic emission layer. As another selective example, the intermediate layer 682 may include the organic emission layer, and further include at least one selected from the group consisting of a hole injection layer (HIL), a hole transport layer (HTL), an electron transport layer (ETL), and an electron injection layer (EIL).

Although a light emitting material is separately included in the respective pixels in the organic light emission layer according to exemplary embodiments as described above, the present inventive concept is not limited thereto. The organic light emission layer may be a common organic light emission layer usable for the entire pixels regardless of locations of the pixels. Here, the organic light emission layer may include light emitting materials to respectively emit red light, green light, and blue light, for example. The light emitting materials may be stacked in a vertical direction or disposed in a mixed manner. The light emitting materials may include materials to emit a combination of different colors as long as white light is emitted from the combination of the different colors. A color conversion layer or a color filter may be further included to convert the emitted white light to a certain color.

After the display unit D is formed on the substrate 610, the encapsulation layer E may be formed on the display unit D. The encapsulation layer E may include a plurality of inorganic layers, or an inorganic layer and an organic layer. For instance, an organic layer of the encapsulation layer E is formed of a polymer material, and may be a single layer formed of one selected from polyethylene terephthalate, polyimide, polycarbonate, epoxy, polyethylene, and polyacrylate, or layers in which such materials are stacked on top of each other. The organic layer may be formed of polyacrylate, and may include a material obtained by polymerizing a monomer composition that includes diacrylate-based monomer and triacrylate-based monomer. Monoacrylate-based monomer may be further included in the monomer composition. A well-known photoinitiator, such as a thermoplastic polyolefin (TPO), may be included in the monomer composition. However, the monomer composition is not limited thereto, and may include epoxy, polyimide, polyethylene terephthalate, polycarbonate, polyethylene, or polyacrylate.

The organic layer included in the encapsulation layer E may be a single layer or stacked layers that include metal oxide or metal nitride. For example, the inorganic layer may include one selected from $SiO_2$, $SiN_x$, $Al_2O_3$, titanium oxide ($TiO_2$), zirconium oxide ($ZrO_x$), and ZnO. An uppermost layer in the encapsulation layer E, exposed to an outside, may be formed of an inorganic layer to prevent moisture penetration into the OLED.

The encapsulation layer E may include at least one sandwich structure in which at least one organic layer is inserted between at least two inorganic layers. As another example, the encapsulation layer E may include at least one sandwich structure in which at least one inorganic layer is inserted between at least two organic layers. For example, as seen in an enlarged portion P, the encapsulation layer E may include a first inorganic layer U1, a first organic layer O1, a second inorganic layer U2, a second organic layer O2, a third inorganic layer U3, and a third organic layer O3 sequentially formed from a top of the OLED.

A halogenated metal layer that includes lithium-fluoride (LiF) may be further included between the OLED and the first inorganic layer U1. The halogenated metal layer may prevent damage to the OLED when the first inorganic layer U1 is formed using, for example, a sputtering method. An area of the first organic layer O1 may be smaller than an area of the second inorganic layer U2, and an area of the second organic layer O2 may be smaller than an area of the third inorganic layer U3. However, the encapsulation layer E is not limited thereto, and may include any structure in which an inorganic layer and an organic layer are stacked on top of each other in various forms.

The protection layer P may be formed on the encapsulation layer E. The protection layer P may be formed using various methods. For example, the protective layer P may be formed using a sputtering method, an ion beam deposition method, an evaporation method, a general chemical vapor deposition method, or the like. The protective layer P may include a metallic oxide or nitride, such as SiNx, SiOxNy, titanium oxide (TiOx), titanium nitride (TiNx), titanium oxynitride (TiOxNy), ZrOx, tantalum nitride (TaNx), tantalum oxide (TaOx), hafnium oxide (HfOx), AlOx, or the like. The protective layer P may be formed to completely surround a side of the encapsulation layer E. Accordingly, the protective layer P may increase life expectancy of the encapsulation layer E by obstructing the encapsulation layer E from moisture or oxygen.

According to one or more exemplary embodiments, the display apparatus 600 may be applied to a display apparatus having flexibility and a display apparatus having rigidity.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a display apparatus, the method comprising:
   causing a substrate of the display apparatus to be positioned with respect to a mask frame assembly; and
   causing a deposition material to be deposited on the substrate according to deposition patterns of the mask frame assembly,
   wherein the mask frame assembly comprises:
   a frame comprising an opening;
   a first support bar spanning the opening in a first direction, the first support bar comprising first ends disposed on the frame;
   split masks spanning the opening in a second direction crossing the first direction, the split masks comprising first portions disposed on the first support bar and second ends disposed on the frame; and a second support bar disposed on the first support bar, the second support bar being more magnetic than the first support bar,
wherein the deposition patterns are formed in the split masks, and
wherein the first support bar is disposed between the split masks and the second support bar.

2. The method of claim 1, wherein:
the substrate is positioned with respect to the mask frame assembly via a chuck; and
a first attractive force between the chuck and the second support bar is greater than a second attractive force between the chuck and the first support bar.

3. The method of claim 2, wherein a strength of the first attractive force weakens from a central portion of the second support bar towards the second ends.

4. The method of claim 1, wherein:
the second support bar is one of a plurality of second support bars disposed on the first support bar; and
the plurality of second support bars are spaced apart from one another in the first direction or the second direction.

5. A mask frame assembly comprising:
a frame comprising an opening;
a first support bar spanning the opening in a first direction, the first support bar comprising first ends disposed on the frame;
split masks spanning the opening in a second direction crossing the first direction, the split masks comprising first portions disposed on the first support bar and second ends disposed on the frame; and
a second support bar disposed on the first support bar, the second support bar being more magnetic than the first support bar,
wherein the first support bar is disposed between the split masks and the second support bar.

6. The mask frame assembly of claim 5, wherein:
a thickness of the first support bar in a third direction perpendicular to the first direction and the second direction is greater than a thickness of the second support bar in the third direction; and
a width of the first support bar in the second direction is greater than a width of the second support bar in the second direction.

7. The mask frame assembly of claim 5, wherein:
the second support bar is one of a plurality of second support bars disposed on the first support bar; and
the plurality of second support bars are spaced apart from one another in the first direction.

8. The mask frame assembly of claim 5, wherein:
the first support bar comprises a groove; and
the second support bar is at least partially disposed in the groove.

9. The mask frame assembly of claim 5, wherein at least one dimension of the second support bar decreases with increasing distance from a central portion of the second support bar towards the second ends.

10. The mask frame assembly of claim 5, wherein:
the frame comprises first grooves disposed on second grooves;
the first ends interface with the first grooves; and
the second ends interface with the second grooves.

11. A display manufacturing apparatus comprising:
a mask frame assembly;
a supporter configured to support the mask frame assembly;
an electrostatic chuck configured to support a substrate in relation to the mask frame assembly; and
a vapor deposition source configured to eject a deposition material towards the substrate,
wherein the mask frame assembly comprises:
a frame comprising an opening;
a first support bar spanning the opening in a first direction, the first support bar comprising first ends disposed on the frame;
split masks spanning the opening in a second direction crossing the first direction, the split masks comprising first portions disposed on the first support bar and second ends disposed on the frame; and
a second support bar disposed on the first support bar, the second support bar being more magnetic than the first support bar, and
wherein the first support bar is disposed between the split masks and the second support bar.

12. The apparatus of claim 11, wherein:
the substrate is disposed between the mask frame assembly and the electrostatic chuck; and
a first attractive force between the electrostatic chuck and the second support bar is greater than a second attractive force between the electrostatic chuck and the first support bar.

13. The apparatus of claim 12, wherein a strength of the first attractive force weakens from a central portion of the second support bar towards the second ends.

14. The apparatus of claim 13, wherein:
the frame comprises first grooves disposed on second grooves;
the first ends interface with the first grooves; and
the second ends interface with the second grooves.

15. The apparatus of claim 11, wherein:
a thickness of the first support bar in a third direction perpendicular to the first direction and the second direction is greater than a thickness of the second support bar in the third direction; and
a width of the first support bar in the second direction is greater than a width of the second support bar in the second direction.

16. The apparatus of claim 11, wherein:
the second support bar is one of a plurality of second support bars disposed on the first support bar; and
the plurality of second support bars are spaced apart from one another in the first direction or the second direction.

17. The apparatus of claim 11, wherein:
the first support bar comprises a groove; and
the second support bar is at least partially disposed in the groove.

18. The apparatus of claim 11, wherein at least one dimension of the second support bar decreases with increasing distance from a central portion of the second support bar towards the second ends.

* * * * *